United States Patent
Nair et al.

(10) Patent No.: US 10,535,634 B2
(45) Date of Patent: Jan. 14, 2020

(54) MULTI-LAYER PACKAGE

(71) Applicant: INTEL CORPORATION, Santa Clara, CA (US)

(72) Inventors: Vijay K. Nair, Mesa, AZ (US); Chuan Hu, Chandler, AZ (US); Thorsten Meyer, Regensburg (DE)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/106,761

(22) PCT Filed: Jul. 22, 2015

(86) PCT No.: PCT/US2015/041618
§ 371 (c)(1),
(2) Date: Jun. 20, 2016

(87) PCT Pub. No.: WO2017/014777
PCT Pub. Date: Jan. 26, 2017

(65) Prior Publication Data
US 2017/0207170 A1 Jul. 20, 2017

(51) Int. Cl.
*H01L 23/04* (2006.01)
*H01L 25/065* (2006.01)
(Continued)

(52) U.S. Cl.
CPC ........ *H01L 25/0657* (2013.01); *H01L 21/486* (2013.01); *H01L 21/4853* (2013.01);
(Continued)

(58) Field of Classification Search
CPC ............ H01L 23/5386; H01L 23/5383; H01L 21/563; H01L 23/5384; H01L 21/565;
(Continued)

(56) References Cited

U.S. PATENT DOCUMENTS 7,858,441 B2 * 12/2010 Lin .................. H01L 23/49816
438/107
8,247,269 B1 8/2012 Liu
(Continued)

OTHER PUBLICATIONS

International Search Report and Written Opinion dated Apr. 22, 2016 for International Application No. PCT/US2015/041618, 13 pages.
(Continued)

*Primary Examiner* — Shouxiang Hu
(74) *Attorney, Agent, or Firm* — Schwabe, Williamson & Wyatt, P.C.

(57) ABSTRACT

Embodiments herein relate to a system in package (SiP). The SiP may have a first layer of one or more first functional components with respective first active sides and first inactive sides opposite the first active sides. The SiP may further include a second layer of one or more second functional components with respective second active sides and second inactive sides opposite the second active sides. In embodiments, one or more of the first active sides are facing and electrically coupled with one or more of the second active sides through a through-mold via or a through-silicon via.

5 Claims, 10 Drawing Sheets

(51) Int. Cl.
*H01L 23/538* (2006.01)
*H01L 21/48* (2006.01)
*H01L 21/56* (2006.01)
*H01L 23/31* (2006.01)

(52) U.S. Cl.
CPC ........ *H01L 21/4857* (2013.01); *H01L 21/563* (2013.01); *H01L 21/565* (2013.01); *H01L 23/3114* (2013.01); *H01L 23/5383* (2013.01); *H01L 23/5384* (2013.01); *H01L 23/5386* (2013.01); *H01L 23/5389* (2013.01); *H01L 25/0652* (2013.01)

(58) Field of Classification Search
CPC ............. H01L 21/486; H01L 21/4857; H01L 23/3114; H01L 21/4853; H01L 23/5389; H01L 25/0652; H01L 25/0657
See application file for complete search history.

(56) References Cited

U.S. PATENT DOCUMENTS

| | | | | |
|---|---|---|---|---|
| 9,659,907 B2* | 5/2017 | Zhai | ...................... | H01L 21/561 |
| 2007/0045875 A1 | 3/2007 | Farnworth et al. | | |
| 2008/0136004 A1* | 6/2008 | Yang | ...................... | H01L 24/96 257/686 |
| 2008/0224306 A1* | 9/2008 | Yang | ...................... | H01L 24/24 257/725 |
| 2010/0140779 A1 | 6/2010 | Lin et al. | | |
| 2010/0213600 A1 | 8/2010 | Lau et al. | | |
| 2011/0278733 A1 | 11/2011 | Saugier | | |
| 2012/0088331 A1 | 4/2012 | Kinzer et al. | | |
| 2012/0104528 A1 | 5/2012 | Akram et al. | | |
| 2013/0200529 A1 | 8/2013 | Lin et al. | | |
| 2013/0343022 A1* | 12/2013 | Hu | ...................... | H01L 25/16 361/761 |
| 2014/0015131 A1 | 1/2014 | Meyer et al. | | |

OTHER PUBLICATIONS

Extended Search Report dated Feb. 18, 2019 for European Application No. 15899090.3, 16 pages.

Office Action dated Jul. 9, 2019 for Japanese Application No. 2017-553208, 21 pages.

* cited by examiner

MULTI-LAYER PACKAGE

CROSS REFERENCE TO RELATED APPLICATIONS

The present application is a national phase entry under 35 U.S.C. § 371 of International Application No. PCT/US2015/041618, filed Jul. 22, 2015, entitled "MULTI-LAYER PACKAGE", which designated, among the various States, the United States of America. The Specification of the PCT/US2015/041618 Application is hereby incorporated by reference.

FIELD

Embodiments of the present disclosure generally relate to the field of package assemblies with a high density interconnect package and a small form factor.

BACKGROUND

Continued reduction in end product size of mobile electronic devices such as smart phones and ultrabooks is a driving force for the development of packaging with a small form factor (SFF). System in package (SiP) technologies have been developed to incorporate multiple components into a single package to reduce the system size.

BRIEF DESCRIPTION OF THE DRAWINGS

FIGS. 1-A through 1-K illustrate an example of a package assembly at various stages of the manufacturing process, in accordance with embodiments.

DETAILED DESCRIPTION

Embodiments of the present disclosure generally relate to the field of high density interconnect packages and very small form factors. In particular, a highly integrated system in package (SiP) is able to be fabricated by integrating two layers of functional components in molding compounds before and after the buildup, and then solder joining or adhesively joining the two molding layers. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

As noted above, package size scaling is important for assembly manufacturing. In some embodiments, the disclosed package may enable: integration of multiple active and passive components of varying x-y- and z-heights; silicon die to silicon die as such as Opossum configurations; panel-level processing; two or more mold compounds to optimize the integration of low density and high density I/O device embedding; implementation of fan-in and fan-out; and aligning and exposing the metal interjects posts without grinding the mold, a via interconnect without an additional plating process. In particular, a highly integrated system in package (SiP) is able to be fabricated by integrating two layers of functional components in molding compounds before and after the buildup, and then solder joining or adhesively joining the two molding layers. This may also have the advantage of a shorter routing distance between components. In addition, this may also have the advantage of attaching passive devices into a mold where the passive devices may be thick components, and active components, which may be very thin, may be attached later in a different layer. As a result, the molded layer may be thick and the attached silicon dies may be thin.

Figure 1:
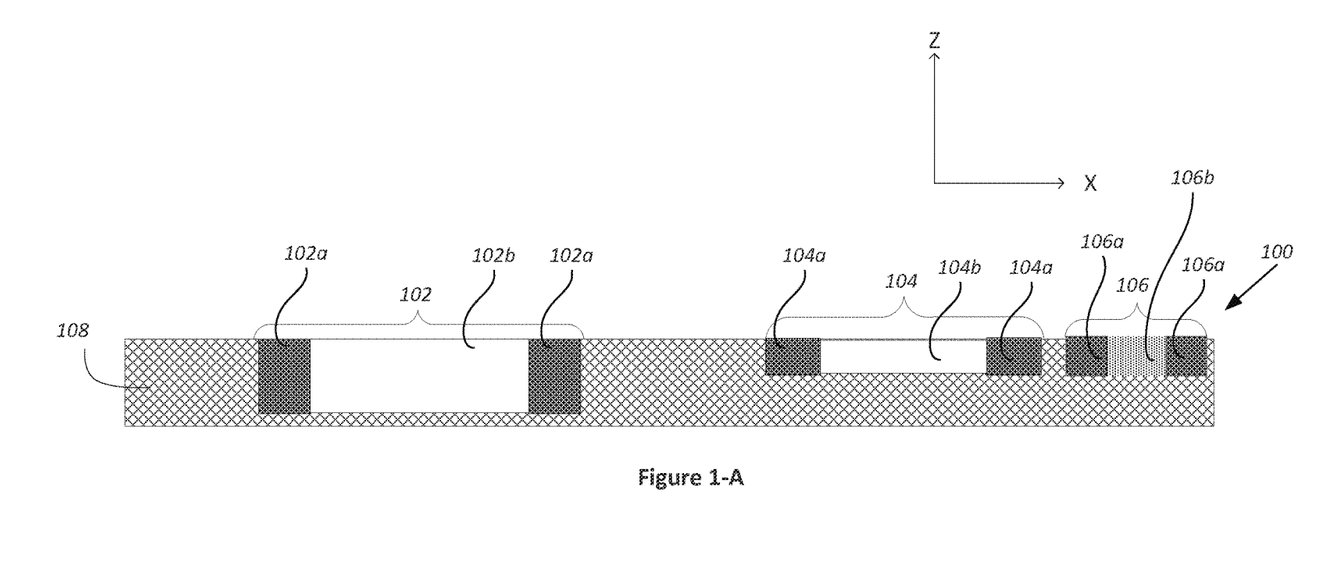
Figure 1:
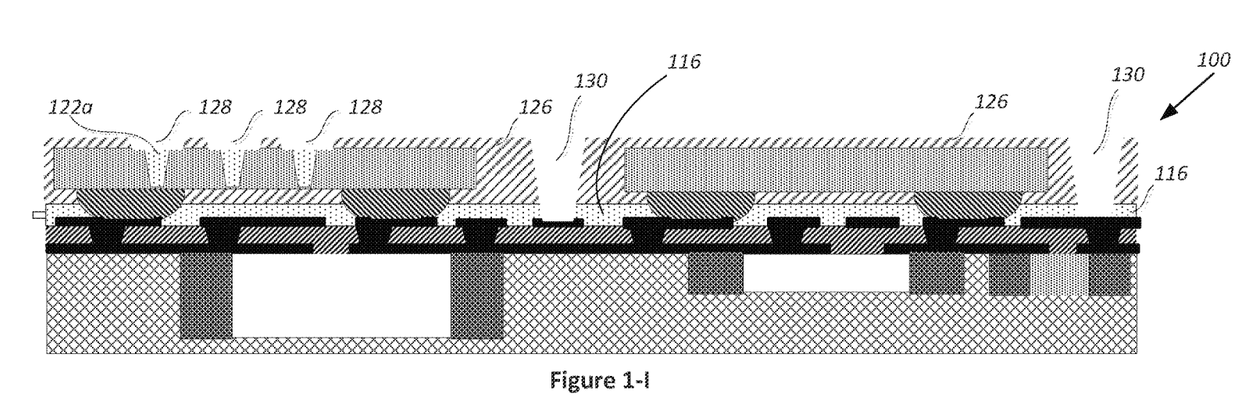

FIGS. 1-A through 1-K depict an example of such a package assembly at various stages of the manufacturing process. In embodiments, one or more elements may be introduced in an earlier figure, for example FIG. 1-A, and then assumed to carry over to later Figures such as 1-B. Therefore, each and every element of the package assembly 100 may not be labeled in each and every stage of FIGS. 1-A through 1-K for the sake of clarity and the ease of understanding.

Specifically, FIG. 1-A depicts a package assembly 100 that includes passive components 102, 104 and an active component 106. In embodiments, sections of the components 102a, 104a and 106a may represent areas where the component can be electrically coupled, and sections of the components 102b, 104b and 106b may represent areas where the component is not able to be electrically coupled. In embodiments, any number of passive or active components may be used. In non-limiting examples, a passive component may include or refer to a resistor or capacitor and an active component may include or refer to a transistor or integrated circuit.

In embodiments, these components may be at least partially surrounded by a mold compound 108. The mold compound 108 may be some other electrically and/or thermally neutral layer that may increase the lateral surface area of, and/or electrically or thermally insulate, the components 102, 104, 106. In some embodiments, mold compound 108 may be epoxy, though in other embodiments the mold compound may be or may include phenolic, unsaturated polyester, thermosetting polyimide, etc.

Each of the components 102, 104, 106 may have different active and inactive sides that are parallel to one another in a first direction and a second direction perpendicular to the first direction of the components. The third direction, which is perpendicular to the first and second directions, may be referred to as the z-height. In embodiments, the z-heights of the components may be less than the z-height of the mold 108.

Next, as shown in FIG. 1-B, in embodiments a conductive layer 110 may be applied to connect the components 102, 104, 106 in various ways. For example, in some embodiments the conductive layer 110 may be applied via sputtering and electroplating or electroless plating and electroplating. In embodiments, a seed layer may be applied first and may be later increased in thickness. The conductive layer 110 may be copper or some other electrically conductive material such as gold (Au).

Subsequently, in embodiments, a dielectric material 112 may be applied over the conductive layer 110. In embodiments, this may be a spin coat, such as WPR photosensitive dielectric material (from JSR Corporation®) or other dielectric material. In embodiments, the dielectric may be applied through lamination.

Next, as shown in FIG. 1-C, vias 114 may be opened in the dielectric material 112. In embodiments, the vias 114 may be opened by an optical method if the dielectric is photosensitive. In other embodiments, the vias 114 may be opened by a laser drill, chemical etching, or some other physical, optical, and/or chemical process.

Next, as shown in FIG. 1-D, a metallization layer 110 for routing may be added. In embodiments, the layer may be a semi-additive with plating, and may be referred to as the second conductive layer. The second conductive layer may allow crossings of the routing and may be applied in the same or similar manner to the first conductive layer.

Next, as shown in FIG. 1-E, solder mask 116 may be deposited and vias 118 may be opened within the mask. In embodiments, a solder mask 116, which may be referred to as a solder stop layer, may be photo-defined dielectric material that may protect the surface layer metallization and provide the opens for connection with other devices. The solder mask 116 may be the same material as the dielectric material 112, and may be spun on, slit coated or laminated. In embodiments, the thickness of the solder mask 116 may be higher than the thickness of the dielectric 112.

Next, as shown in FIG. 1-F, solder bumps 120 may be added. In embodiments, flux may be applied in a printing process on the vias 118 to form areas for solder bumps 120. In embodiments, pre-formed solder bumps 120 may then be applied, for example through a stencil in a printing-like process. In embodiments, the package may then be run through a reflow process, where the flux may remove the oxide layers on the pad and the solder bumps 112, and the solder bump(s) 112 may melt and make contact to the pad.

Next, as shown in FIG. 1-G, one or more dies 122, 124 may be attached to and electrically coupled to the solder bumps 120. The dies 122, 124 may be, for example, silicon or some other electrically or thermally conductive or semi-conductive material. Although not shown, in some embodiments, the dies 122, 124 may include one or more transistor devices and/or various layers of interconnect structures formed on an active side of the dies 122, 124 to route electrical signals and/or power to the one or more transistors devices. In embodiments, the active side of a die or component may be the side to which the die or component may be electrically coupled. The inactive side, which may be the opposite side, is the side to which the component may not be able to be electrically coupled. Specifically, in some embodiments the dies 122, 124 may include one or more layers or materials such as a dielectric material, a substrate, a semiconductor material, a passivation layer, or some other material or layer that may be known in the art. In embodiments, vias 122a may be incorporated into a die 122.

Next, as shown in FIG. 1-H, the dies 122, 124 may be underfilled and molded 126. In embodiments, a transfer mold may be done at the wafer level and/or may be done at the panel level. In embodiments, the material used for the mold may have two components that may include a softer phase, such as resin or polymer, and may include a harder phase such as silicon dioxide ($SiO_2$) or silicon carbide (SiC). The softer phase may provide the mobility for the material to flow under certain condition and the harder phase may provide the desired mechanical strength once the flow is done and fully cured.

Next, as shown in FIG. 1-I, through-mold vias 128, 130 may be cut through the mold 126. In embodiments, the vias 128 may be cut only through the mold 126. In other embodiments, the vias 130 may be cut through the mold 126 and the solder mask 116. In embodiments, this may be done with a laser or chemical, physical or other optical process, or may be done with one of the silicon dies having a through-silicon via 122a.

Next, as shown in FIG. 1-J, the vias 128, 130 may be plated 110. In embodiments, this may involve sputtering, electro-plating or electroless plating, and/or other methods such as paste printing, solder sintering, or solder reflow. In embodiments, additional molding 132 may be added.

Next, as shown in FIG. 1-K, the package 100 may be flipped, and solder balls in an area array orientation may be applied to achieve a ball grid array (BGA) 134 may be attached. In embodiments, at this point the dies 122, 124 are facing the components 102, 104, 106 are in separate molds, are bonded in a face-to-face alignment and are electrically coupled. This structure may have the advantages of a shorter connection between the dies 122, 124 and components 102, 104, 106. It may also have advantages of supporting extra fan in, the number of inputs of a logic gate, or fan out, number of logic inputs that the logic output of the structure is able to drive.

Figure 2:
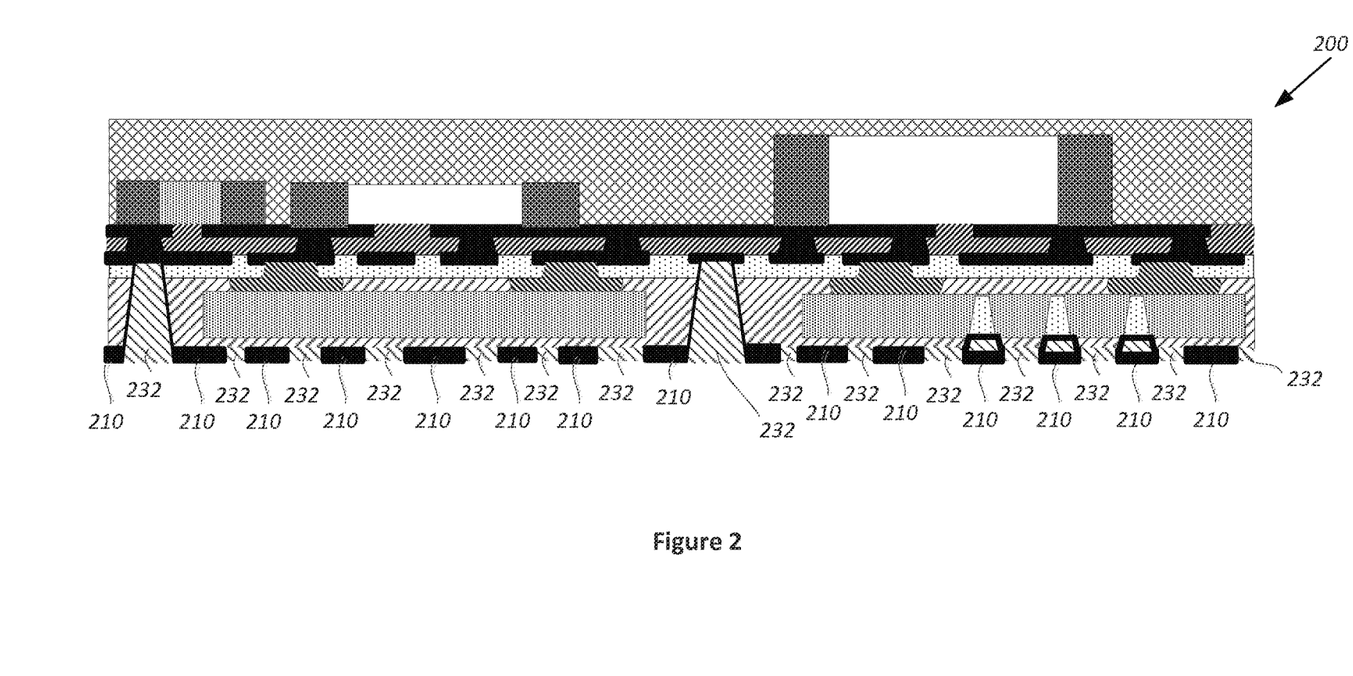
FIG. 2 illustrates another example of a package assembly at the end stages of the manufacturing process, in accordance with embodiments.

FIG. 2 depicts an alternative package assembly 200 that may implement a land grid array (LGA). In embodiments, an LGA implementation may result in a smaller overall form factor, specifically in z-height of the overall package. In embodiments, the package shown in FIG. 1-J may be flipped and landing pads for a land grid array (LGA) may be attached. In embodiments, an LGA may be formed by opening the solder mask 116 and then plating or depositing a conductive layer in the via area (e.g. at or near vias 122*a*). Therefore, the LGA may include conductive components 210 and non-conducting components 232. Package assembly 200 differs from package assembly 100 in FIG. 1-K by allowing a lower-profile LGA connection rather than a higher-profile BGA connection that may require soldering. In embodiments, the lower stand-off height of the package may provide increased reliability.

Figure 3:
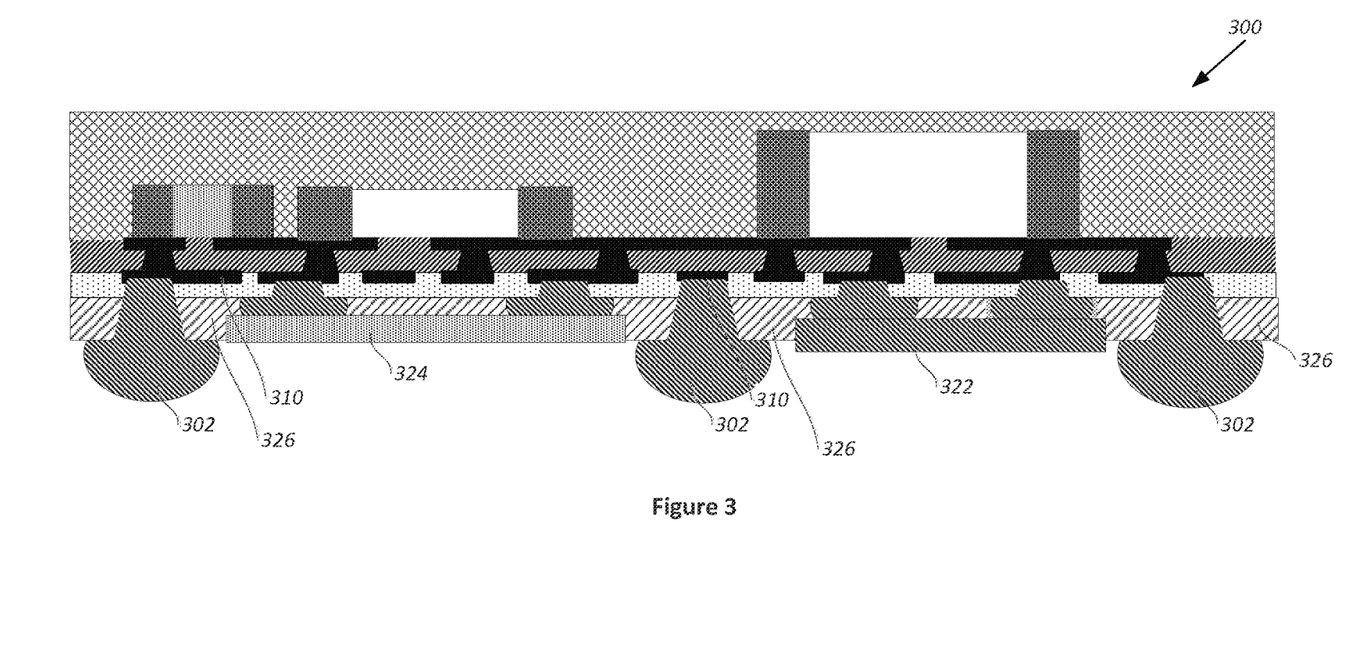
FIG. 3 illustrates another example of a package assembly at the end stages of the manufacturing process, in accordance with embodiments.

FIG. 3 depicts an alternative package assembly 300 that may implement a ball grid array (BGA) ball out 302 that may fill larger through-mold vias. In embodiments, a thin mold layer, 326 (like 126 of FIG. 1-H) may be instead applied in a way that may leave the upper part of dies 322, 324 (like 122, 124 of FIG. 1-H) exposed. This may be useful, for example, when extra fan in, fan out, and/or routing buildup may not be needed. With the upper part of dies 322, 324 not surrounded by molding, there may be an advantage of additional heat dissipation.

Figure 4:
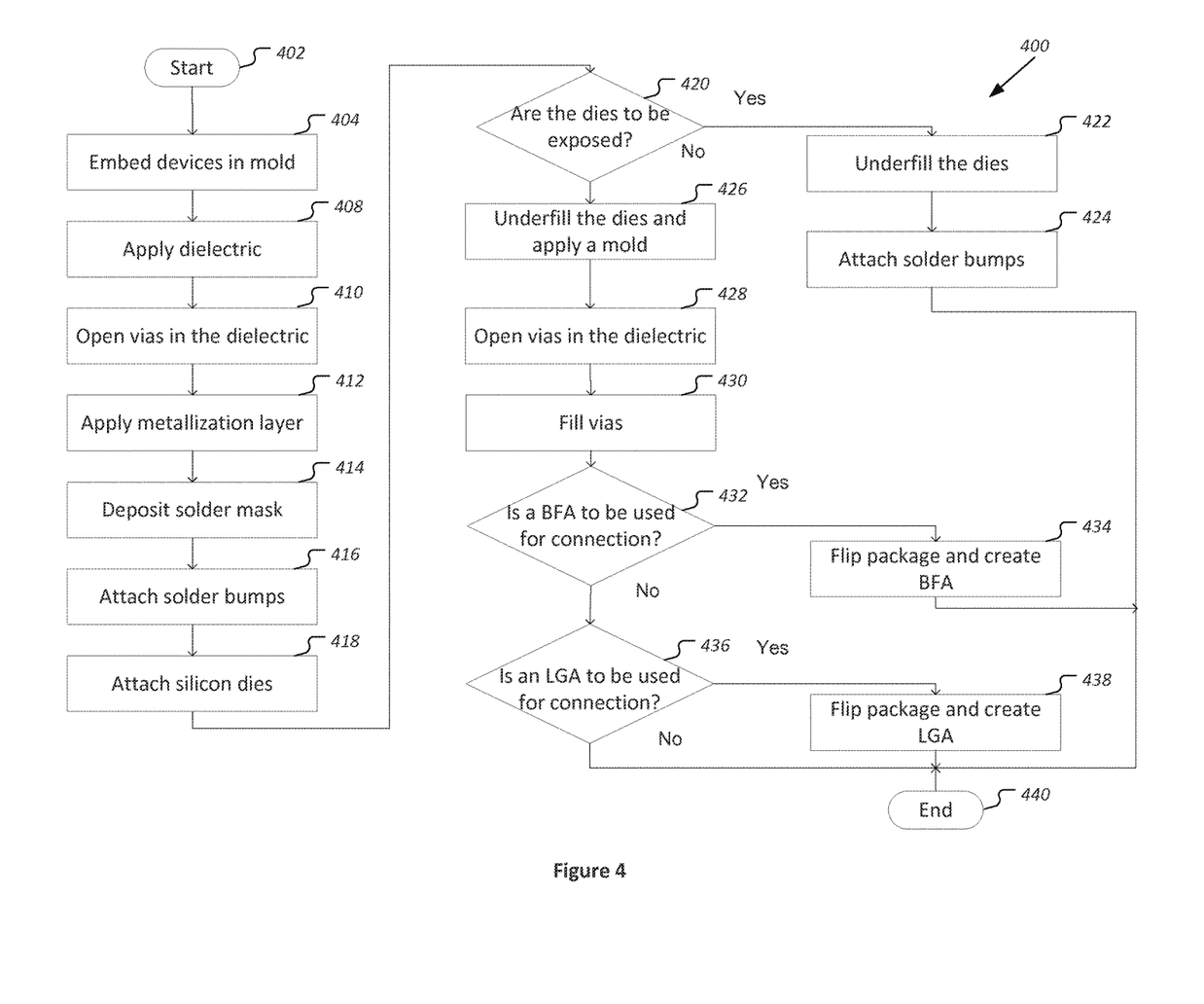
FIG. 4 illustrates an example of a process for manufacturing a package assembly, in accordance with embodiments.

FIG. 4 depicts a flow diagram showing a method 400 for manufacturing a package assembly such as package assembly 100, according to various embodiments. The method 400 may start at block 402.

At block 404, devices such as components 102, 104, 106 may be embedded in a mold. In embodiments, the devices may be embedded in a mold on a wafer (not shown), the molded wafer may be released and flipped. In other embodiments, devices may include passive components such as passive components 102, 104 and/or active components such as active component 106 as shown in FIG. 1-A (after the wafer may have been flipped). In embodiments, a mold compound such as mold compound 108 may either partially or completely surround the components.

At block 408, a dielectric such as dielectric layer 112 may be applied. In embodiments, this may also include the application of a conductive layer such as conductive layer 110 to connect the one or more components such as components 102, 104, 106 in various ways. The conductive layer 110 may be of some electrically conductive metal. In embodiments, a dielectric such as dielectric 112 may be applied over the conductive layer such as conductive layer 110, and to the edge of the molding such as molding 108 as shown in FIG. 1-B. The dielectric such as dielectric 112 may include a spin coat WPR, or other suitable dielectric material. In embodiments, low temperature cure polyimides may be used. In other embodiments, laminated layers may be used, for example if substrates are rectangular.

At block 410, vias such as vias 114 in the dielectric such as dielectric 112 may be opened. In embodiments, the dielectric vias such as vias 114, shown on FIG. 1-C, may be opened by an optical method, for example if the dielectric is photosensitive, or may be opened by a laser drill.

At block 412, a metallization layer such as metallization layer 110 may be applied for routing. In embodiments, the metallization layer 110 may be of an electrically conductive metal, as shown in FIG. 1-D.

At block 414, a solder mask such as solder mask 116 on FIG. 1-E may be deposited and vias such as vias 118 in the solder mask may be opened.

At block 416, solder bumps such as solder bumps 120 may be attached.

At block 418, dies such as silicon dies 122, 124 may be attached. Embodiments of the attached silicon dies are shown on FIG. 1-G, and may include being attached to solder bumps 120.

At block 420, a check may be performed to determine if a portion of the dies such as dies 122, 124 are to be exposed. If a result of the determination shows that the dies are to be exposed, then at block 422 the dies may be underfilled. In embodiments, molding material, such as molding material 126 as shown in FIG. 1-H may be flowed under dies 122, 124, leaving the surfaces and/or upper parts of the dies 122, 124 exposed (not shown). At block 424, solder bumps such a solder bumps 302 in FIG. 3 may be attached. Thereafter, the method 400 may end at block 440

If at block 420, a portion of the dies are not to be exposed, then at block 426 the dies such as dies 122, 124 may be underfilled and a mold such as mold 126 may be applied over the dies. In embodiments, the mold such as mold 126 may encase the dies 122, 124.

At block 428, through-mold vias such as vias 128,130 may be opened. In embodiments, through-mold vias 128, 130 may be cut through a mold such as mold 126 as shown in FIG. 1-I. In embodiments, a via such as via 128 may be cut only through a mold such as mold 126. In other embodiments, a via such as via 130 may be cut through a mold such as mold 126 and the solder mask 116. In embodiments, this may be done with a laser, or may be done with one of the silicon dies having a through-silicon via 122*a*.

At block 430, vias such as vias 128, 130 may be filled. In embodiments, the vias such as vias 128, 130 may be plated with electrically conductive material such as material 110 as found in FIG. 1-J. In other embodiments, vias may be plated with methods such as electroplating, electroless plating, paste printing, solder sintering, or solder reflow. In still other embodiments, after the plating, additional molding such as molding 132 may be added, and the additional molding may contain vias (not shown) to allow access to the electrically conductive material 110.

At block 432, a check may be performed to determine if a BGA such as BGA 134 is to be used for connections. If the result of the determination shows that a BGA is to be used for connections, then at block 434, the package may be flipped and a BGA such as BGA 302 may be connected to electrically conductive material such as electrically conductive material 310 (like 210 of FIG. 2; and/or like 110 of FIGS. 1B, 1D, 1J and 1K) which may be through-vias such as vias (not shown) in molding 132. Thereafter, the method 400 may end at block 440.

If at block 432 a BGA is not to be used for connection, then at block 436 a check may be performed to determine if an LGA is to be used for connection. In embodiments, an LGA layer may be made up of electrically conductive material such as electrically conductive material 210 (like 110 of FIGS. 1B, 1D, 1J and 1K) separated by a top molding layer such as top molding layer 212. If the result of the determination shows that an LGA is to be used, then at block 438 the package may be flipped and an LGA connection may be created. In embodiments, the LGA connection may be of the layout as shown in FIG. 2. Thereafter, the method 400 may end at block 440.

Figure 5:
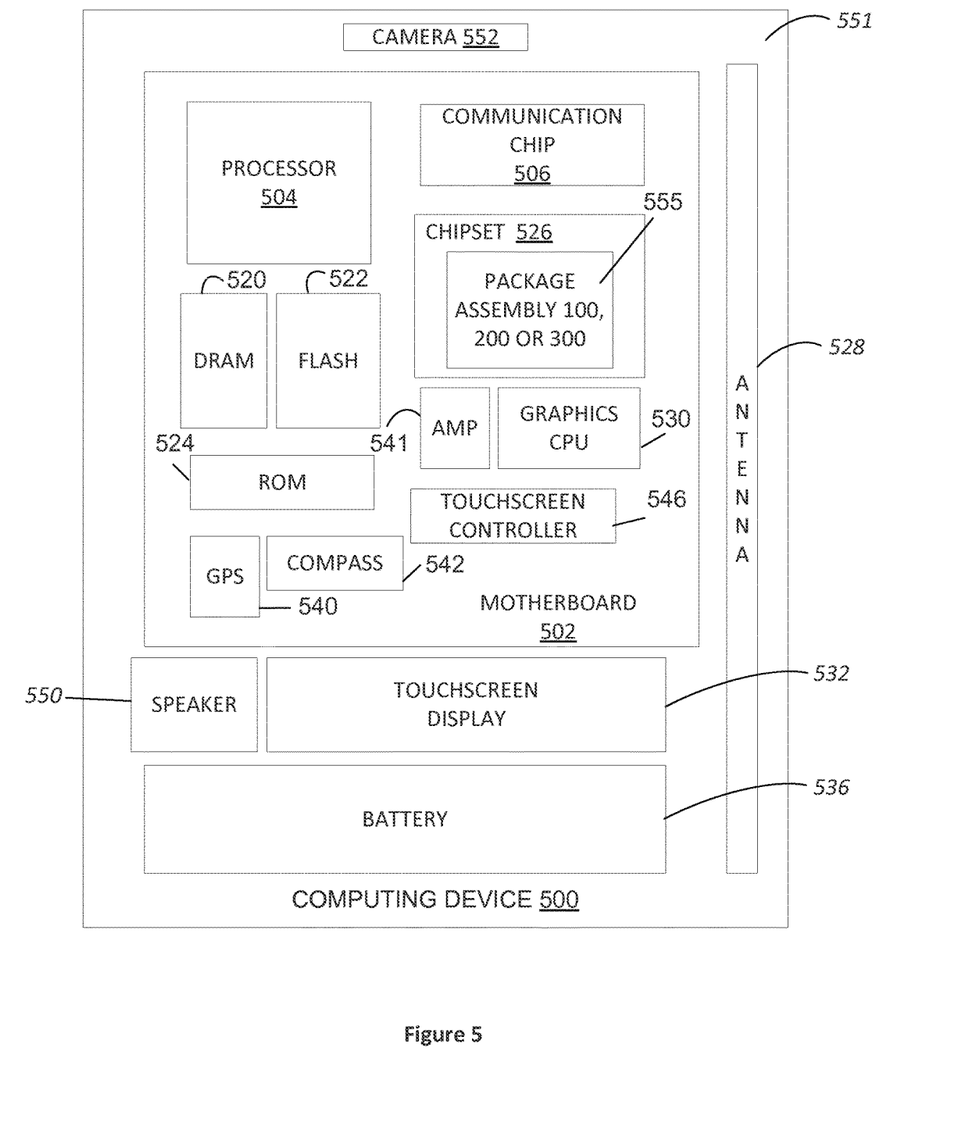
FIG. 5 schematically illustrates a computing device, in accordance with embodiments.

Embodiments of the present disclosure may be implemented into a system using any suitable hardware and/or software to configure as desired. FIG. 5 schematically illustrates a computing device 500 in accordance with one implementation of the invention. The computing device 500 may house a board such as motherboard 502 (i.e. housing 551). The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM) 520, non-volatile memory (e.g., ROM) 524, flash memory 522, a graphics processor 530, a digital signal processor (not shown), a crypto processor (not shown), a chipset 526, an antenna 528, a display (not shown), a touchscreen display 532, a touchscreen controller 546, a battery 536, an audio codec (not shown), a video codec (not shown), a power amplifier 541, a global positioning system (GPS) device 540, a compass 542, an accelerometer (not shown), a gyroscope (not shown), a speaker 550, a camera 552, and a mass storage device (such as hard disk drive, compact disk (CD), digital versatile disk (DVD), and so forth) (not shown). Further components, not shown in FIG. 5, may include a microphone, a filter, an oscillator, a pressure sensor, or an RFID chip. In embodiments, one or more of the package assembly components 555 may be a package assembly such as package assembly 100 shown in FIG. 1-K, package assembly 200 shown in FIG. 2, or package assembly 300 shown in FIG. 3.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others. In some embodiments, one or more of the communication chips may include a die in a package assembly such as, for example, one of package assemblies 100, 200, 300 described herein.

The processor 504 of the computing device 500 may include a die in a package assembly such as, for example, one of package assemblies 100, 200, 300 described herein. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data, for example an all-in-one device such as an all-in-one fax or printing device.

EXAMPLES

Example 1 is a package comprising: a first layer of one or more first components molded into a wafer that has a first active layer side and a first inactive layer side opposite the first active layer side, wherein respective components of the one or more first components have a respective first active component side and a first inactive component side opposite the first active component side that are parallel to one another in a first direction and a second direction perpendicular to the first direction, and respective ones of the one or more first components have a respective z-height measurement in a third direction perpendicular to the first direction and the second direction, and a z-height of a first one of the one or more first components is different than a z-height of a second one of the one or more first components; and a second layer of one or more second components in a molding that has a second active layer side and a second inactive layer side opposite the second active layer side, and wherein the one or more second components have a second active component side and a second inactive component side opposite the second active component side that are parallel to one another along the first direction and the second direction, and wherein the second active layer side is facing, electrically coupled, and physically coupled with the first active layer side, and the second active layer side is electrically coupled to the second inactive layer side through a through mold via or a through silicon via.

Example 2 may include the subject matter of Example 1, further comprising a land grid array or a ball grid array attached to the second inactive side and electrically coupled to the second active side.

Example 3 may include the subject matter of any of Examples 1 to 2, wherein the second active layer side is physically coupled with the first active layer side via solder or adhesive.

Example 4 may include the subject matter of any of Examples 1 to 3, wherein a length of one of the one or more first components in the first direction is longer than a length of one of the one or more second components in the first direction.

Example 5 is a package comprising: a first layer of one or more first functional components with respective first active sides and first inactive sides opposite the first active sides; a second layer of one or more second functional components with respective second active sides and second inactive sides opposite the second active sides; and wherein one or more of the first active sides are facing and electrically coupled with one or more of the second active sides through a through-mold via or a through-silicon via.

Example 6 may include the subject matter of Example 5, wherein the first layer of one or more first functional components are molded into a wafer.

Example 7 may include the subject matter of any of Examples 5 to 6, wherein the second layer of one or more second functional components are in a molding.

Example 8 may include the subject matter of Example 7, wherein the molding includes cyclic olefin copolymer.

Example 9 may include the subject matter of any of Examples 5 to 8, wherein the first active side of respective ones of the one or more first functional components and the first inactive side of the respective ones of the one or more first functional components are parallel to one another in a first direction and a second direction perpendicular to the first direction, respective ones of the one or more first components have a respective z-height measurement in a third direction perpendicular to the first direction and the second direction, and a z-height of a first one of the one or more first components is different than a z-height of a second one of the one or more first components.

Example 10 may include the subject matter of any of Examples 5 to 9, wherein a functional component is a passive component or an active component.

Example 11 may include the subject matter of Example 10, wherein a passive component is a resistor or a capacitor.

Example 12 may include the subject matter of Example 10, wherein an active component is a transistor or an integrated circuit.

Example 13 may include the subject matter of any of Examples 5 to 12, wherein the package is a system in package (SiP).

Example 14 is a system with a package assembly, the system comprising: a circuit board; a package assembly coupled with the circuit board, the package assembly comprising: a first layer of one or more first functional components with respective first active sides and first inactive sides opposite the first active sides; a second layer of one or more second functional components with respective second active sides and second inactive sides opposite the second active sides, wherein one or more of the first active sides are facing and electrically coupled with one or more of the second active sides through a through-mold via or a through-silicon via.

Example 15 may include the subject matter of Example 14, wherein the first active side is electrically coupled with the second inactive side by a through mold via or a through-silicon via.

Example 16 may include the subject matter of any of Examples 14 to 15, further comprising a land grid array or a ball grid array that is attached to the second inactive side and electrically coupled to the first active side.

Example 17 may include the subject matter of any of Examples 14 to 16, wherein the first layer and second layers are molded.

Example 18 may include the subject matter of Example 17, wherein the first layer mold and the second layer mold are of different compounds.

Example 19 may include the subject matter of Example 18, wherein the first or second functional component is a fan-out component.

Example 20 may include the subject matter of any of Examples 14 to 19, wherein the first active side of respective ones of the one or more first functional components and the first inactive side of the respective ones of the one or more first functional components are parallel to one another in a first direction and a second direction perpendicular to the first direction, respective ones of the one or more first components have a respective z-height measurement in a third direction perpendicular to the first direction and the second direction, and a z-height of a first one of the one or more first components is different than a z-height of a second one of the one or more first components.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A package comprising:
    a first layer of two or more first components molded into a wafer that has a first active layer side and a first inactive layer side opposite the first active layer side, wherein respective components of the two or more first components have a respective first active component side and a first inactive component side opposite the first active component side that are parallel to one another in a first direction and a second direction perpendicular to the first direction, and respective ones of the two or more first components have a respective z-height measurement in a third direction perpendicular to the first direction and the second direction, and a z-height of a first one of the two or more first components is different than a z-height of a second one of the two or more first components; and a second layer of two or more second components in a molding that has a second active layer side and a second inactive layer side opposite the second active layer side, and wherein the two or more second components have a second active component side and a second inactive component side opposite the second active component side that are parallel to one another along the first direction and the second direction, and wherein the second active layer side is facing, electrically coupled, and physically coupled with the first active layer side, and the second layer at the second active layer side includes a first and a second through-mold vias, wherein the first through-mold via is on a through silicon via extending from the second active side to the second inactive side inside at least one of the second components; wherein the second through-mold via is located between two of the second components and extends to the first active layer side; and wherein the first through-mold via and at least a center portion of the second through-mold via are filled with a non-conductive material.

2. The package of claim 1, further comprising a land grid array or a ball grid array attached to the second inactive side and to electrically couple to the second active side.

3. The package of claim 1, wherein the second active layer side is physically coupled with the first active layer side via solder or adhesive.

4. The package of claim 1, wherein a length of one of the two or more first components in the first direction is longer than a length of one of the two or more second components in the first direction.

5. The package of claim 1, further comprising a conductor in the through silicon via to electrically couple to the second inactive layer side.

* * * * *